(12) United States Patent
Stubbers et al.

(10) Patent No.: US 9,728,376 B2
(45) Date of Patent: Aug. 8, 2017

(54) COMPACT HIGH-VOLTAGE PLASMA SOURCE FOR NEUTRON GENERATION

(71) Applicant: Starfire Industries, LLC, Champaign, IL (US)

(72) Inventors: Robert A. Stubbers, Champaign, IL (US); Daniel P. Menet, Champaign, IL (US); Michael J. Williams, Mahomet, IL (US); Brian E. Jurczyk, Champaign, IL (US)

(73) Assignee: STARFIRE INDUSTRIES, LLC, Champaign, IL (US)

( * ) Notice: Subject to any disclaimer, the term of this patent is extended or adjusted under 35 U.S.C. 154(b) by 1082 days.

(21) Appl. No.: 14/216,269

(22) Filed: Mar. 17, 2014

(65) Prior Publication Data

US 2017/0196073 A1 Jul. 6, 2017

Related U.S. Application Data

(60) Provisional application No. 61/793,327, filed on Mar. 15, 2013.

(51) Int. Cl.
  *H01J 7/24* (2006.01)
  *H01J 37/32* (2006.01)
  *H05H 1/02* (2006.01)

(52) U.S. Cl.
  CPC .......... *H01J 37/32009* (2013.01); *H05H 1/02* (2013.01)

(58) Field of Classification Search
  CPC ............... H01J 37/32009; H01J 37/321; H01J 37/3211; H05H 1/02; H05H 1/12; H05H 1/18; H05H 1/24
  See application file for complete search history.

(56) References Cited

U.S. PATENT DOCUMENTS

| 3,779,864 A | 12/1973 | Kaw et al. | |
| 5,146,137 A * | 9/1992 | Gesche | H01J 37/32165 313/231.31 |
| 6,164,241 A * | 12/2000 | Chen | H01J 37/321 |
| 6,304,036 B1 * | 10/2001 | Freeman | H01J 37/321 315/111.21 |

(Continued)

FOREIGN PATENT DOCUMENTS

| EP | 2341525 A2 | 7/2011 |
| WO | WO 03/032434 A1 | 4/2003 |

(Continued)

OTHER PUBLICATIONS

European Patent Office, Supplementary European Search Report in corresponding European Application No. 14763556.9 dated Oct. 24, 2016 (9 pages).

(Continued)

*Primary Examiner* — Jason M Crawford
(74) *Attorney, Agent, or Firm* — Leydig, Voit & Mayer, Ltd.

(57) ABSTRACT

Systems and methods are described herein for coupling electromagnetic (EM) energy from a remotely-located primary antenna into a plasma ion source. The EM energy is radiated by a first by through an intermediary secondary antenna. The embodiments described herein enable the elevation of the plasma ion source to a high electric potential bias relative to the primary antenna, which can be maintained at or near a grounded electric potential.

20 Claims, 6 Drawing Sheets

(56) References Cited

U.S. PATENT DOCUMENTS

| | | | |
|---|---|---|---|
| 6,907,097 B2 | 6/2005 | Leung | |
| 7,362,842 B2* | 4/2008 | Leung | G21B 3/00 |
| | | | 250/423 R |
| 8,123,903 B2* | 2/2012 | Lee | H01J 37/321 |
| | | | 118/723 AN |
| 9,472,370 B2* | 10/2016 | Perkins | H01J 27/04 |
| 2003/0234355 A1 | 12/2003 | Leung et al. | |
| 2005/0130450 A1* | 6/2005 | Kwon | H01J 37/321 |
| | | | 438/795 |
| 2006/0236931 A1* | 10/2006 | Singh | C23C 14/48 |
| | | | 118/723 E |
| 2006/0267503 A1* | 11/2006 | Bystriskii | G21B 1/052 |
| | | | 315/111.21 |
| 2009/0260972 A1* | 10/2009 | Yonesu | H05H 1/24 |
| | | | 204/164 |
| 2009/0297730 A1* | 12/2009 | Glukhoy | C23C 16/045 |
| | | | 427/571 |
| 2010/0066252 A1 | 3/2010 | Reijonen et al. | |
| 2011/0004418 A1 | 1/2011 | Chillrud et al. | |
| 2011/0044418 A1 | 2/2011 | Stubbers et al. | |

FOREIGN PATENT DOCUMENTS

| | | |
|---|---|---|
| WO | WO 2009/099887 A1 | 8/2009 |
| WO | WO 2010/099244 A2 | 9/2010 |

OTHER PUBLICATIONS

International Search Report and Written Opinion for co-pending International Patent Application No. PCT/US2014/030535 (Jul. 3, 2014).

* cited by examiner

COMPACT HIGH-VOLTAGE PLASMA SOURCE FOR NEUTRON GENERATION

CROSS-REFERENCE TO RELATED APPLICATIONS

This application claims priority to U.S. Provisional Patent Application Ser. No. 61/793,327, titled "Compact High-Voltage Plasma Source" and filed on Mar. 15, 2013, the contents of which are expressly incorporated herein by reference in their entirety including the contents and teachings of any references contained therein.

FIELD OF THE INVENTION

This invention relates to compact plasma sources, and more particularly to compact plasma sources into which electromagnetic energy may be coupled via a combination of a primary antenna and a secondary antenna.

BACKGROUND OF THE INVENTION

Accelerator based neutron generators have a wide variety of applications including medicine, security, and oil and gas exploration. Accelerator based neutron generators extract ions produced at an ion source and accelerate them through an accelerator tube towards a target where collisions produce fusion reactions that yield neutrons. Some accelerator based neutron generators utilize radio frequency (RF) driven plasma ion sources. Some such RF driven plasma sources rely on coupling RF energy produced by an RF antenna into the plasma source to drive plasma production.

SUMMARY OF THE INVENTION

An apparatus is described herein for generating a plasma ion source in a vacuum chamber, the apparatus comprising a plasma ion source dielectric configured to encapsulate the vacuum chamber a secondary antenna positioned external to an exterior surface of the plasma ion source dielectric and configured to couple electromagnetic (EM) radiation into the plasma ion source in the vacuum chamber, and a primary antenna electrically isolated from the secondary antenna and configured to transmit electromagnetic (EM) radiation to the secondary antenna, wherein the plasma ion source chamber, the plasma ion source dielectric, and the secondary antenna are biased at a positive electric potential with respect to the primary antenna.

A method is described herein for generating a plasma ion source, the method comprising radiating, by a primary antenna, electromagnetic (EM) energy, coupling the EM energy radiated by the primary antenna into a secondary antenna, radiating, by the secondary antenna, EM energy, and coupling the EM energy radiated by the secondary antenna into a plasma through a plasma ion source dielectric disposed between the secondary antenna and the plasma, and maintaining an electric potential difference between the primary antenna and each of the plasma ion source chamber, the plasma ion source dielectric, and the secondary antenna.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in different embodiments. The features and advantages of various embodiments will become apparent by reading the following detailed description with reference to the attached drawings which illustrate the following.

DETAILED DESCRIPTION OF THE INVENTION

Figure 1:
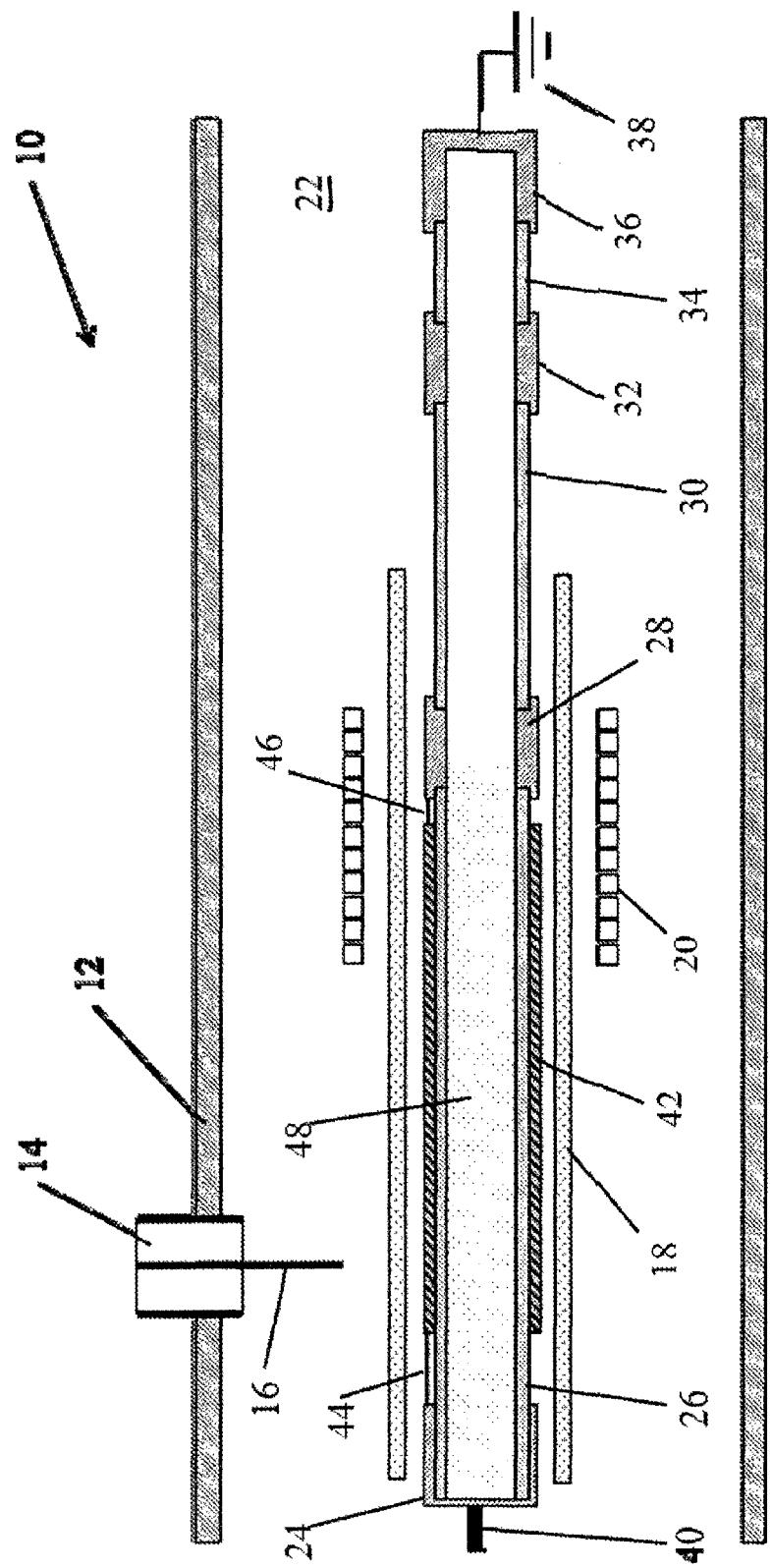
FIG. 1 depicts plasma ion source neutron generator utilizing a combination of a primary resonator and a secondary resonator to couple electromagnetic energy into a plasma according to an embodiment of the invention.

It can be difficult to efficiently couple electromagnetic energy, e.g. radio frequency (RF) energy, into confined geometries of compact plasma sources. Efficient RF energy coupling often requires that the RF antenna be positioned in close proximity to the plasma source. Typically, compact RF-driven plasma sources utilize a single EM resonator, e.g. an RF antenna, directly coupled to and mounted on a plasma source chamber.

In order to extract an ion beam from a plasma source for, e.g., neutron generator applications, an electric potential gradient with sufficient magnitude for ion acceleration must be created and maintained between the plasma source and a target. Many neutron generators create electric potential gradients suitable for ion acceleration by maintaining EM resonators and plasma sources at ground potential and supplying a very low voltage electric potential to the target. Enclosures capable of providing the requisite level of electrical insulation to maintain the target at a sufficiently low voltage impose limitations on target thermal management, e.g. cooling, on target size, on the distance between the target and the object being analyzed, and on the distance between the target and analysis detectors. Therefore, the utility of such generators for various detection schemes and applications is limited. Furthermore, this approach requires the on-board high-voltage power supply be located adjacent to the target thereby further limiting the utility of such generators. However, by maintaining the plasma source at ground potential, such configurations eliminate the need to electrically insulate the EM resonator and other electronic components and also eliminate increased costs associated with using specialized electronic components capable of operating at large magnitude voltages.

An alternative approach is to electrically float (and isolate) the plasma ion source up to the applied voltage of the generator in a large dielectric enclosure to achieve a grounded target. In order to produce a high quality plasma at high voltages, e.g. greater than 50 kV, either a very large amount of RF energy must be supplied into a large cavity or the RF generator driving the plasma must also be elevated to high voltages. The first option is inefficient and prohibited for many applications and the latter option results in a very bulky and expensive system, as the entire system must be enclosed in dielectric and isolated.

Thermo Fisher MF Physics sells a D711 high-output neutron generator having an ion source electrically-floated up to the applied voltage of the generator in a large dielectric enclosure to achieve a grounded target suitable for placing the source of neutrons in close proximity to the application. However, to achieve this, a 1000 kg enclosure, pressurized with SF6 gas with a 24-inch diameter is required.

Starfire Industries discloses, in U.S. Patent Application Publication No. 2011/0044418, methods and apparatuses to couple RF or microwave energy into a plasma source elevated to a positive potential, with respect to the neutron generating target, using a dielectric intermediary that is transparent to the electromagnetic energy while providing sufficient insulation to prevent breakdown or electrical contact with a source of electromagnetic energy. This method allows for permanent magnets to provide a magnetic field suitable for plasma formation and extraction.

Another factor limiting compact plasma sources operating at a high voltage is the need for a magnetic field surrounding and confining the plasma source to facilitate plasma generation and sustainment. Magnets not only take up space, they must also often be placed near the plasma generation region to function effectively. As magnets are typically conductors that interfere with high-voltage insulation and RF propagation, the requirement that they be positioned near the plasma source chamber presents another obstacle to coupling RF energy into the plasma.

Some applications, such as wellbore exploration, require neutron generators having a very small diameter. However, prior art neutron generators of sufficiently small size are subject to a number of limitations. Such imitations include a reduced atomic fraction (unless power can be increased to compensate), decreased neutron production efficiency, and heating resulting from increasing input power to offset losses in efficiency. Achieving a sufficient electric potential gap between the plasma and the target requires greater spatial separation between an antenna and the plasma, which decreases coupling efficiency.

The illustrative examples contemplate a variety of systems and methods for using secondary electromagnetic (EM) antennas, including radio frequency (RF) and microwave antennas, to couple EM energy emitted by a remotely-located primary antenna into a compact plasma ion source. Applications of such methods and systems include compact high-voltage plasma sources for neutron generators. Other applications include, but are not limited to, plasma thrusters for space propulsion, ion-beam assisted deposition and etching sources, and atmospheric pressure discharge plasmas. Such systems and methods also enable production of compact neutron generators that exhibit decreased size and improved EM power coupling into the plasma. In particular, such systems and methods enable EM power coupling where the plasma is biased to elevated voltages and where conducting structures, such as magnets, are positioned between the primary antenna and the plasma ion source.

The illustrative examples contemplate a secondary antenna placed on or near a surface of a dielectric material that confines a plasma source thereby enabling remotely-supplied EM energy to be coupled into the plasma source to build up sufficient energy to generate or sustain a plasma. In various implementations, the resulting plasma source may be either pulsed or steady-state.

Such a secondary antenna enables simultaneous elevation of the plasma source to a high voltage and maintenance of the EM generator, the primary antenna, and other electronic components at, or near, ground potential. Enabling the EM generator, the primary antenna, and other electronic components to remain at, or near, ground potential obviates the need to electrically insulate such components thereby allowing generators of reduced size to be constructed. Furthermore, such a configuration eliminates the need to utilize specialized electronic components capable of operating at high electric potentials and instead allows the use of less expensive off-the-shelf electronic components. Furthermore, by allowing the plasma ion source to be elevated to a high electric potential, the secondary antenna enables the target to be simultaneously maintained at, or near, ground potential. Maintaining the target near ground potential eliminates the need to enclose the target within electrical insulation thereby enabling the target to be positioned in closer to the object being examined, or probed. Positioning the target in closer to the object being examined allows the area of maximum flux (i.e. the target) to be located as desired in relation to other objects. Furthermore, a grounded target can easily be thermally integrated with other components to allow direct conduction and convection. Therefore, a target maintained near ground potential can be cooled more easily than can a target lowered to a very low electric potential relative to ground.

In various embodiments, the target is nevertheless biased at negative potential with respect to ground for increased ion acceleration. Two small power supplies can produce the same electric potential difference as one large power supply when a negatively-biased target is combined with a positively-biased plasma ion source. The utilization of two power supplies allows size reduction for small-diameter applications (relative to generators utilizing a single large power supply) and production of higher accelerating electric potentials for more fusion reactions.

The secondary antenna utilized in some embodiments can also enable the primary antenna (or EM feed) to be decoupled, both spatially and galvanically, from the plasma source. Therefore, the utilization of the secondary antenna provides a greater degree of control over delivery of EM energy. Furthermore, the secondary antenna enables transmission of remotely-supplied EM energy into regions that a single primary antenna would be unable to reach. In particular, the secondary antenna can be positioned, at least partially, within, or beneath, a conducting structure that would effect a considerable attenuation of EM fields produced by the primary antenna. The secondary antenna can therefore increase the intensity of an EM field in regions between a magnetic structure and the plasma source and thereby circumvent the attenuating effect on EM fields generated by a primary antenna that a magnetic structure positioned between the primary antenna and the plasma source would have.

The compact size of neutron generators enabled by the invention is ideal for size, weight and power (SWaP) limited applications. Such applications include well logging and cargo inspection where neutron generators having a diameter of less than two inches and a weight below twenty kilograms is desired. Furthermore, certain embodiments of the present invention are capable of producing sharp plasma rise and fall times (e.g. less than 5 μsec). Sharp rise and fall times, and particularly fall time, are a consequence of the small geometry and high power density in the plasma region (rise-time and low jitter) enabled through use of the secondary antenna. An illustrative example of the present invention achieves high-current plasma pulses (e.g. greater than 10 mA) within a small geometry form factor (e.g. less than half an inch) with very fast rise and fall times (e.g. less than 5 μsec).

The following sections describe, in detail, several embodiments utilizing secondary antenna coupling schemes to couple electromagnetic energy from a remotely-located primary antenna into a compact plasma ion source elevated to a high voltage. The Figures described in the following sections are example embodiments and do not imply any limitation regarding components and configurations of alternative embodiments of the invention.

FIG. 1 depicts a neutron generator utilizing a combination of a primary antenna and a secondary antenna to couple electromagnetic energy into a plasma ion source. Neutron generator 10 comprises a conducting outer enclosure 12, a feedthrough 14, and a primary antenna 16. The conducting outer enclosure 12 serves as the electrical ground 38 for the system. The primary antenna 16 is fastened to the outer enclosure 12 through the feedthrough 14. A dielectric 22 fills the space between the interior surface of the conducting outer enclosure 12 and the remaining components of the neutron generator 10. The dielectric 22 may be any of, but is not limited to, $SF_6$, oil, Fluorinert, or plastic.

The neutron generator 10 further comprises an plasma ion source dielectric 26, a plasma ion source chamber 48, a secondary antenna 42, an anode electrode 28, a beam stop electrode 24, a connector 40, and electrical connections 44 and 46. The interior surface of the plasma ion source dielectric 26 defines the plasma ion source chamber 48 in which a plasma ion source can be produced. The beam stop electrode 24 and the anode electrode 28 are positioned at opposite ends of the plasma ion source chamber 48 along a longitudinal axis of the neutron generator 10. Each, or both of the beam stop electrode 24 and the anode electrode 28 can be configured to elevate the electric potential of the plasma ion source dielectric 26 (and thus the plasma ion source chamber 48). The connector 40 is configured to feed high voltage to, i.e. elevate the electric potential of, the beam stop electrode 24.

The secondary antenna 42 is positioned outside of the exterior surface of the plasma ion source dielectric 26 between the beam stop electrode 24 and the anode electrode 28. The secondary antenna 42 is positioned adjacent to the exterior surface of the plasma ion source dielectric 26 along the longitudinal axis of the neutron generator 10 and encapsulates the plasma ion source dielectric 26 along transverse axes of the neutron generator 10. In various implementations, the secondary antenna 42 may have any shape selected from a group including but not limited to a coil, a strip, a slot line, a helix, a plate, a paddle and a tube.

The neutron generator 10 further includes a magnet assembly 20. Various embodiments contemplated by the present invention further include a dielectric sleeve 18. The magnet assembly 20 is positioned between the interior surface of the conducting outer enclosure 12 and the exterior surface of the plasma ion source dielectric 26 along a transverse axis of the neutron tube 10. The magnet assembly 20 is positioned adjacent to the secondary antenna 42 along a portion of the longitudinal axis of the neutron tube 10. For the portion of the longitudinal axis of the neutron tube 10 along which the magnet assembly 20 is positioned adjacent to the secondary antenna 42, the magnet assembly 20 is positioned between the interior surface of the conducting outer enclosure 12 and the secondary antenna 42. Therefore, from a perspective external to the neutron generator, a portion of the secondary antenna 42 extends underneath the magnet assembly 20. This portion of the secondary antenna 42 positioned between the plasma ion source dielectric 26 and the magnet assembly 20 enables EM energy to be coupled into a region of the plasma ion source in which the magnet assembly intercepts the path of EM radiation produced by the primary antenna 16.

The magnet assembly 20 is configured to provide a region of high magnetic flux density to inhibit radial and axial loss of plasma to the interior surfaces of the plasma ion source chamber 48. Furthermore, the magnet assembly 20 can be configured to produce a magnetic field region suitable for resonant wave absorption of EM energy at a specific frequency within the plasma ion source chamber 48. The plasma ion source chamber 48 can be a cylindrical tube with a diameter of less than one inch and the magnet assembly 20 covers half of the length of the plasma ion source chamber along a longitudinal axis of the plasma ion source chamber. The presence of the magnet assembly 20 can significantly impede propagation of an EM wave from an external antenna into the plasma ion source chamber 48. Positioning a portion of the secondary antenna 42 between the magnet assembly 20 and the plasma ion source dielectric 26, the secondary antenna 42 can absorb EM energy from the primary antenna and re-radiate EM energy directly into the plasma ion source chamber 48. The use of the secondary antenna thereby enables the size of the plasma ion source chamber to be reduced while retaining the ability for the plasma ion source to be biased to high positive voltages.

In the embodiment depicted in FIG. 1, the optional dielectric sleeve 18 is positioned adjacent to the secondary antenna 42 along the longitudinal axis of the neutron tube 10 and is positioned between the magnets 20 and the secondary antenna 42 along a transverse axis of the neutron generator 10. The optional dielectric sleeve 18 provides additional electric potential standoff between the grounded conducting outer enclosure 12 and the positively biased components in the interior of the neutron generator 10, e.g. the plasma ion source chamber 48 and any plasma contained therein.

Also included in the neutron generator 10 is a high voltage insulator dielectric 30, an electron suppression electrode 32, a shielded insulator 34, and a target 36. The high voltage insulating dielectric 30 enables the maintenance of an acceleration electric field, formed between the anode 28 and suppressor 32 and target 36, that directs ions extracted from the plasma ion source through the electron suppression electrode 32 and towards the target 36. The shielded insulator 34 separates the electron suppression electrode 32 and the target 36 thereby enabling the electric potential of the target to be maintained at or near ground potential. In some implementations, the target 36 is electrically connected to a ground 38.

During operation, the primary antenna 16 is energized with EM energy from an external EM energy source (not shown) maintained at or near ground potential. EM energy is coupled from the primary antenna 16 to the secondary antenna 42 through dielectric 22 (as well as dielectric sleeve 18 in embodiments where it is included). The secondary antenna 42 couples the EM energy received from the primary antenna 16 into the plasma ion source chamber 48 to sustain any plasma therein. The primary antenna 16 may couple the EM energy to the secondary antenna 42 through any of capacitive (electric) coupling, inductive (magnetic) coupling, or resonant (electric and magnetic) coupling. The secondary antenna 42 may then couple, or transmit, the EM energy to a plasma in the plasma ion source chamber 48 via any of capacitive, inductive or resonant coupling. Resonant coupling between the secondary antenna 42 and a plasma in the plasma ion source chamber 48 may include electron-cyclotron resonance (ECR), ion cyclotron resonance (ICR), and helicon, upper hybrid and other plasma-wave interactions. Secondary antennas and transmission lines can work to improve each of the coupling methods. Resonant coupling of the primary antenna 16 to the secondary antenna 42 may involve exploiting the natural electromagnetic frequency of the primary antenna 16, the secondary antenna 42, or both. It is not required that the primary-to-secondary antenna coupling mechanism be the same as the secondary antenna-to-plasma coupling mechanism. Various embodiments of the present invention utilize various combinations of primary-to-secondary antenna coupling mechanism and secondary antenna-to-plasma coupling mechanism.

In the embodiment depicted in FIG. 1, the primary antenna 16 is resonantly coupled to the secondary antenna 42. In various embodiments, the conducting outer enclosure 12 can be configured to resonate with the primary antenna 16. The primary antenna 16 and the secondary antenna 42 can be configured to have natural electromagnetic frequencies near the frequency of the EM energy emitted by the external EM energy source to promote efficient energy coupling between the elements. In the embodiment depicted in FIG. 1, the secondary antenna 42 is resonantly coupled to the plasma 48 via electron cyclotron resonance (ECR). ECR can be achieved through producing a magnetic flux density (via the magnet assembly 20) such that electrons in a portion of the plasma have a natural gyration frequency that matches the frequency of the EM energy emitted by the external EM energy source.

Figure 2:
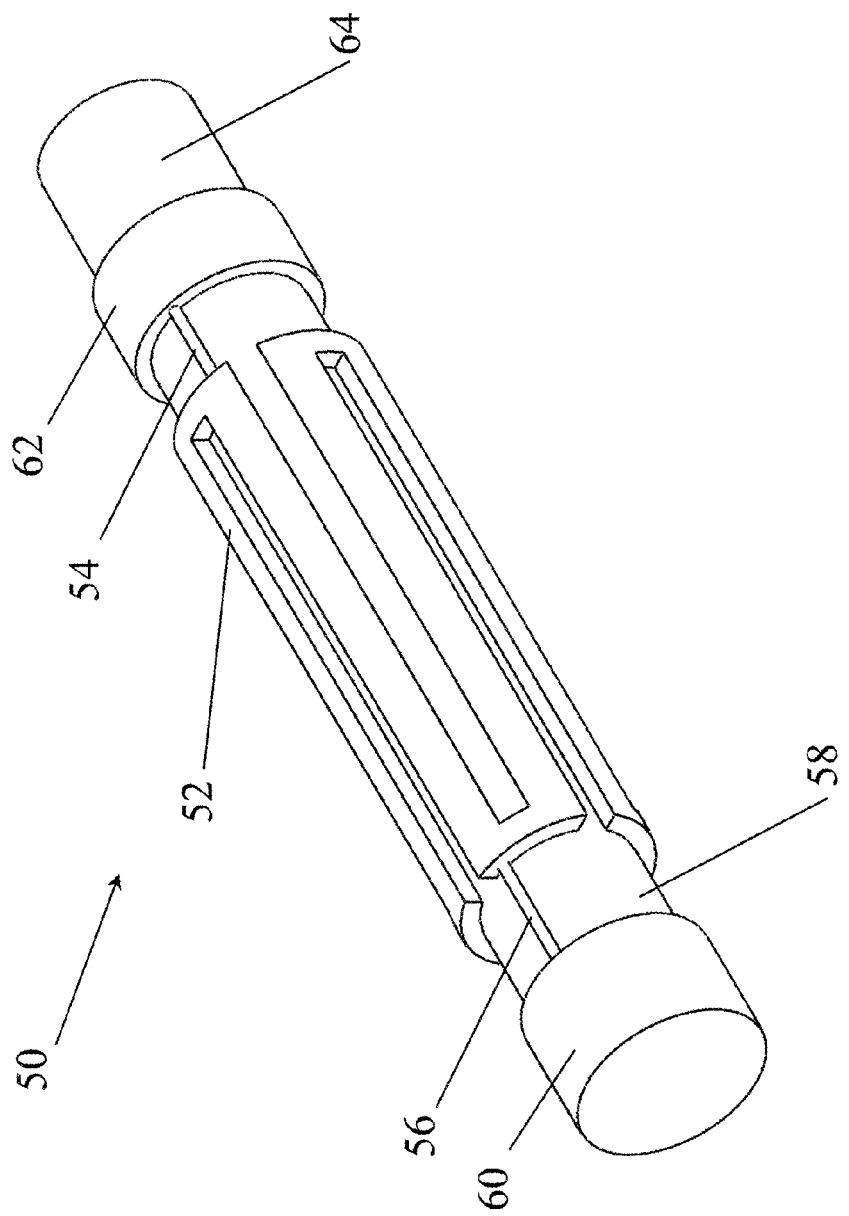
FIG. 2 depicts a secondary antenna configuration for coupling electromagnetic energy into a plasma ion source via resonant coupling according to an embodiment of the invention.

FIG. 2 depicts a secondary antenna assembly for coupling electromagnetic energy into a plasma ion source via resonant coupling. The secondary antenna assembly 50 depicted in FIG. 2 includes a secondary antenna structure 52, electrical connections 54 and 56, a plasma ion source dielectric 58, a beam stop electrode 60, an anode electrode 62, and a portion of an ion accelerating region 64. Certain elements depicted in FIG. 2 correspond to elements depicted in FIG. 1. For example, the secondary antenna structure 52 corresponds to the secondary antenna 42, the electrical connections 54 and 56 correspond to the electrical connections 44 and 46, the plasma ion source dielectric 58 corresponds to the plasma ion source dielectric 26, the beam stop electrode 60 corresponds to the beam stop electrode 24, and the anode electrode 62 corresponds to the anode electrode 28.

In the embodiment depicted in FIG. 2, the secondary antenna structure 52 encircles plasma ion source dielectric 58. The secondary antenna structure 52 may be, in various embodiments, a slot-line antenna, a slow-wave antenna, a Lisitano coil, or a variety of other antenna structures. During operation, electromagnetic energy from a primary antenna (not shown) is received by the secondary antenna structure 52 and energy is built up as currents flow. In order to maximize the resonant coupling between the primary antenna and the secondary antenna structure 52, the resonant electromagnetic frequency of the secondary antenna should be tuned to match, or at least approximate, the frequency of the electromagnetic energy being supplied by the primary antenna. For example, in an embodiment where the secondary antenna structure 52 is a slot line antenna, the length of the slot-line should be selected to equal approximately one half of a wavelength of the electromagnetic energy supplied by the primary antenna.

Electrical connections 54 and 56 may be used to supply a high voltage to (i.e. raise the electric potential of) the beam stop electrode 60 and the anode electrode 62. The electrical connections 54 and 56 may be part of the secondary antenna structure 52 circuit or could be independent.

In the embodiment depicted in FIG. 2, the secondary antenna structure is positioned on the exterior surface of the plasma ion source dielectric 58. As a result of this configuration, a component of electromagnetic waves propagating through the secondary antenna structure 52 has an apparent speed different than the speed of electromagnetic radiation in a vacuum. In the embodiment shown in FIG. 2, the secondary antenna structure 52 can be referred to as a slow wave structure. The reduction in apparent speed of the electromagnetic radiation coupled into the plasma ion source by the secondary antenna structure 52 facilitates resonant coupling between the secondary antenna structure 52 and the plasma ion source, e.g. electron-cyclotron, lower-hybrid, and upper-hybrid resonance coupling. In the embodiment depicted in FIG. 2, the secondary antenna 52 is matched with the desired plasma conditions and externally-applied magnetic field (not shown) to achieve a resonant coupling between the secondary antenna and the plasma. This improves power coupling and allows high-density plasma generation within a compact form factor. For example, magnetic flux density values around 300-360 Gauss are ideal for resonant electron-cyclotron coupling for a plasma driven with microwave radiation having a frequency of 915 MHz, excitation magnetic flux density values around 300-360 Gauss are ideal for resonant electron-cyclotron coupling. Using a slow-wave antenna allows operation at a higher primary drive frequency, e.g. 2.45 GHz, while using lower B-field within the ion source plasma region 58 for resonant behavior.

Figure 3:
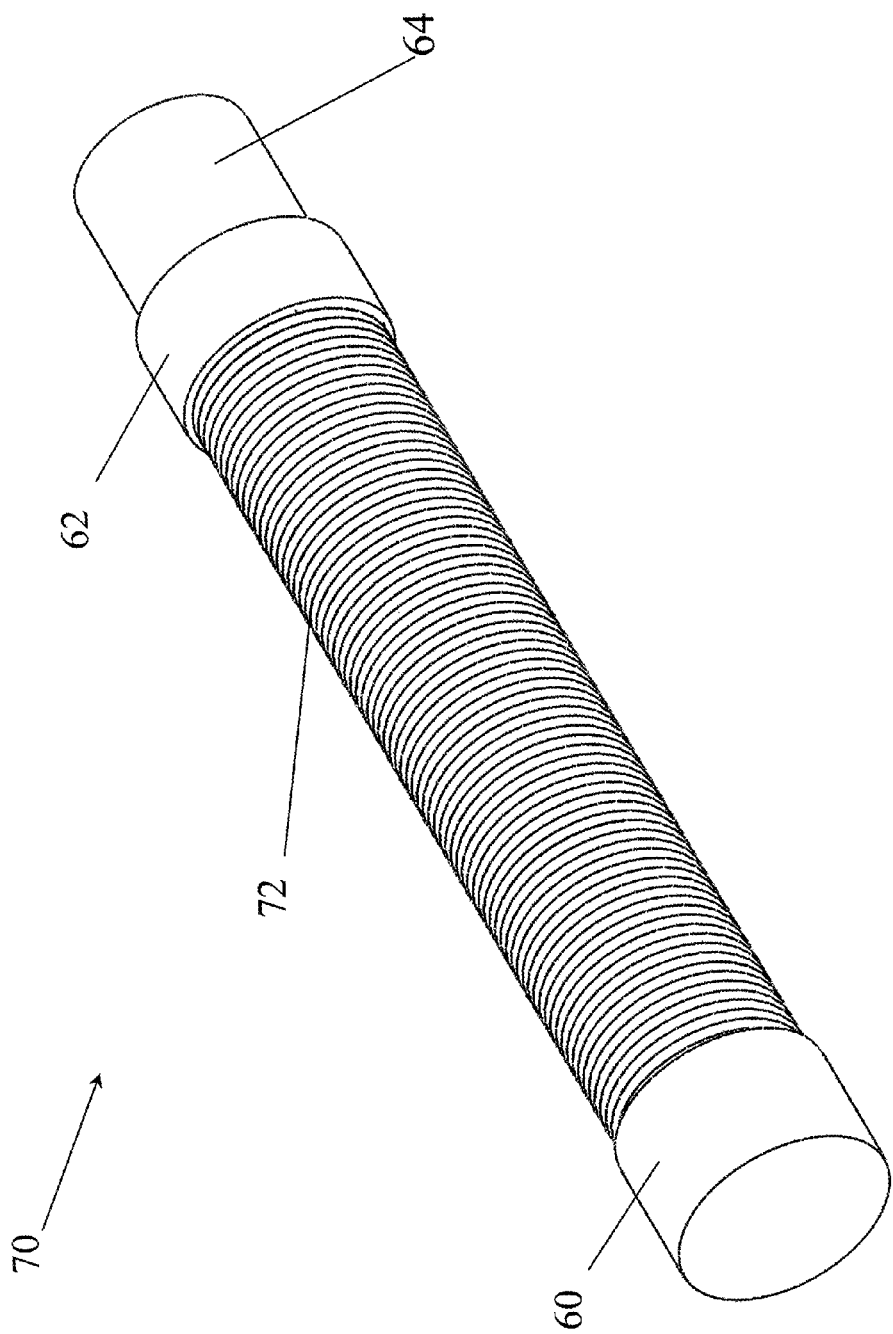
FIG. 3 depicts a secondary antenna configuration for coupling electromagnetic energy into a plasma ion source via capacitive coupling according to an embodiment of the invention.

FIG. 3 depicts a secondary antenna assembly 70 for coupling electromagnetic energy into a plasma ion source via capacitive coupling. The secondary antenna assembly 70 depicted in FIG. 3 includes a secondary antenna structure 72, a beam stop electrode 60, an anode electrode 62, and a portion of an ion accelerating region 64. Certain elements depicted in FIG. 3 correspond to elements depicted in FIG. 1. For example, the secondary antenna structure 72 corresponds to the secondary antenna 42, the beam stop electrode 60 corresponds to the beam stop electrode 24, and the anode electrode 62 corresponds to the anode electrode 28.

The secondary antenna structure 72 depicted in FIG. 3 includes a coil wrapped around the surface of an ion-source dielectric (not shown—hidden beneath the secondary antenna structure 72) that encloses a plasma ion source and that forms a vacuum tube connected to the beam stop electrode 60 and the anode electrode 62.

During operation, electromagnetic energy from a primary antenna (not shown) is picked up by the wrapped coil secondary antenna structure 72 thereby producing voltages and currents sufficient to generate and sustain a plasma inside of the plasma ion-source dielectric positioned underneath the secondary antenna structure 72. The secondary antenna structure 72 is capable of coupling electromagnetic energy into the plasma ion source via capacitive coupling. The capacitive coupling of electromagnetic energy into the plasma region can be scaled through selection of a number of turns in the wrapped coil as well as the thickness and spacing on the coil 72. Specifically, properties of the secondary antenna structure 72 can be tuned according to desired plasma conditions and an externally-applied magnetic field to achieve a capacitive coupling effect between the secondary antenna and the plasma. For example, the turns ratio and coil spacing could generate a desired voltage within the plasma for facilitating axial electron movement for efficient plasma generation between the beam stop electrode 60 and the anode electrode 62.

Figure 4:
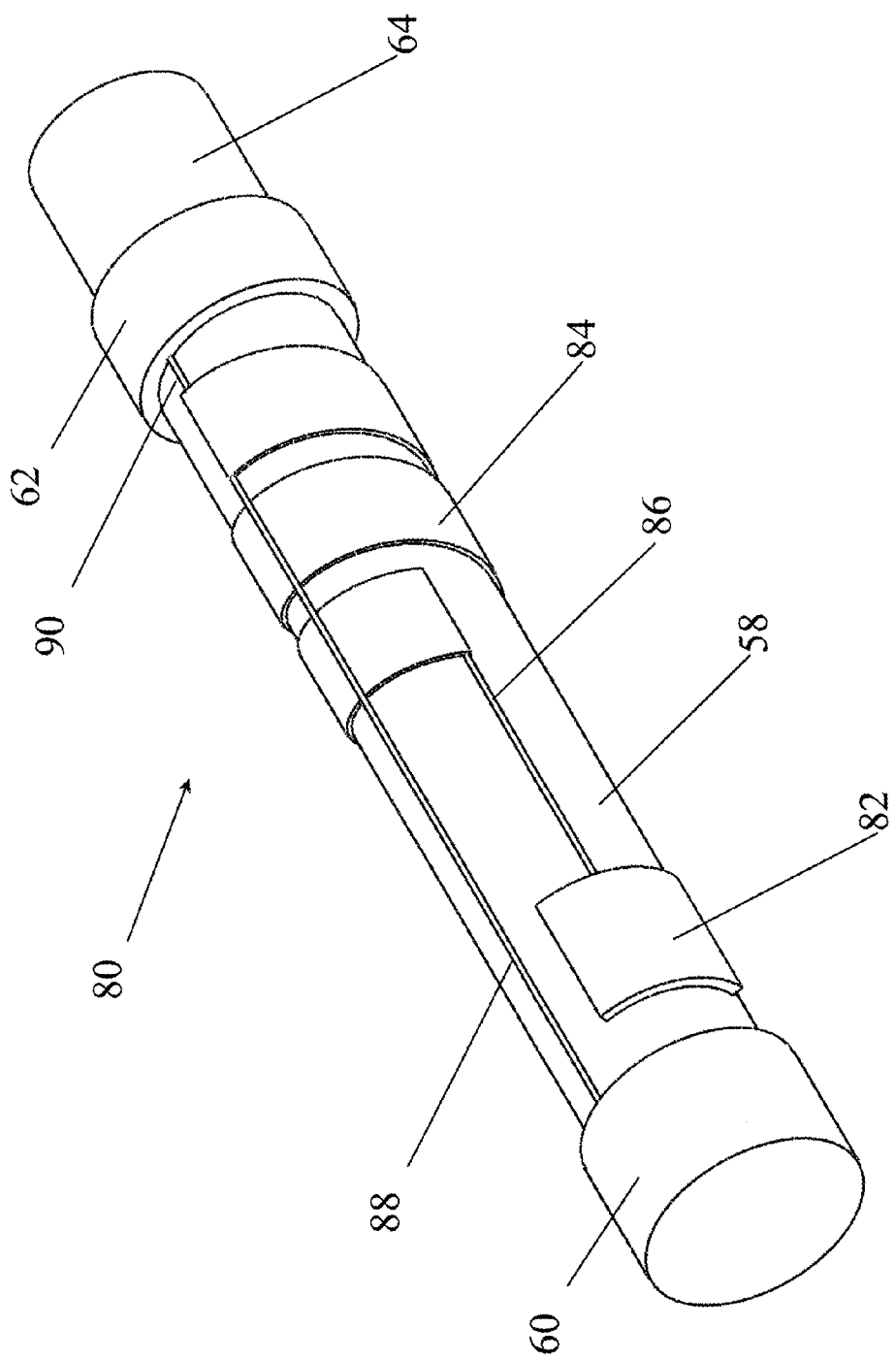
FIG. 4 depicts a secondary antenna configuration for coupling electromagnetic energy into a plasma ion source via inductive coupling according to an embodiment of the invention.

FIG. 4 depicts a secondary antenna assembly 80 for coupling electromagnetic energy into a plasma ion source via inductive coupling. The secondary antenna assembly 80 depicted in FIG. 2 includes a primary pickup element 82, a secondary antenna structure 84, electrical connections 86, 88, and 90, a plasma ion source dielectric 58, a beam stop electrode 60, an anode electrode 62, and a portion of an ion accelerating region 64. Certain elements depicted in FIG. 4 correspond to elements depicted in FIG. 1. For example, the secondary antenna structure 84 corresponds to the secondary antenna 42, the plasma ion source dielectric 58 corresponds to the plasma ion source dielectric 26, the beam stop electrode 60 corresponds to the beam stop electrode 24, and the anode electrode 62 corresponds to the anode electrode 28.

The secondary antenna structure 84 depicted in FIG. 4 includes a sparsely-wrapped coil positioned over a region within the plasma ion source dielectric 58 in which plasma is generated. The secondary antenna structure 84 allows high electric currents to flow at, e.g., radio frequencies to couple electromagnetic energy into the plasma via magnetic induction. During operation of the embodiment depicted in FIG. 4, the secondary antenna structure 84 is excited by capacitive coupling of a primary antenna (not shown) to the primary pickup element 82. The primary pickup element 82 excites the secondary antenna structure 84 through the connector 86. Alternatively, the secondary antenna structure can be excited through connectors 88 and 90 as a result of capacitive coupling of the primary antenna to the beam stop electrode 60 and to the anode electrode 64, respectively. In the embodiment depicted in FIG. 4, energy is transmitted from a receiving portion of the secondary antenna assembly 80 (e.g. the primary pickup element 82) to a plasma-coupling portion of the secondary assembly 80. In some implementations, a magnetic structure is positioned between the plasma-coupling portion and the primary antenna while the receiving portion is positioned beyond the magnetic structure. In this manner, electromagnetic energy may be coupled into the plasma from a location in which a magnetic structure inhibits direct coupling from the primary antenna. Electrical connections 88 and 90 between beam stop electrode 60 and anode electrode 62 may also be used to raise the electric potential of the entire secondary antenna assembly 80.

In this embodiment, the sparsely-wrapped secondary antenna 84 can be matched with the desired plasma conditions and externally-applied magnetic field (not shown) to achieve an inductive coupling effect between the secondary antenna and the plasma. For example, the turns-ratio and coil spacing can be selected to generate a desired radiofrequency current with the plasma ion source to facilitate azimuthal electron movement for efficient generation of plasma beneath the sparsely-wrapped secondary antenna 84.

Figure 5:
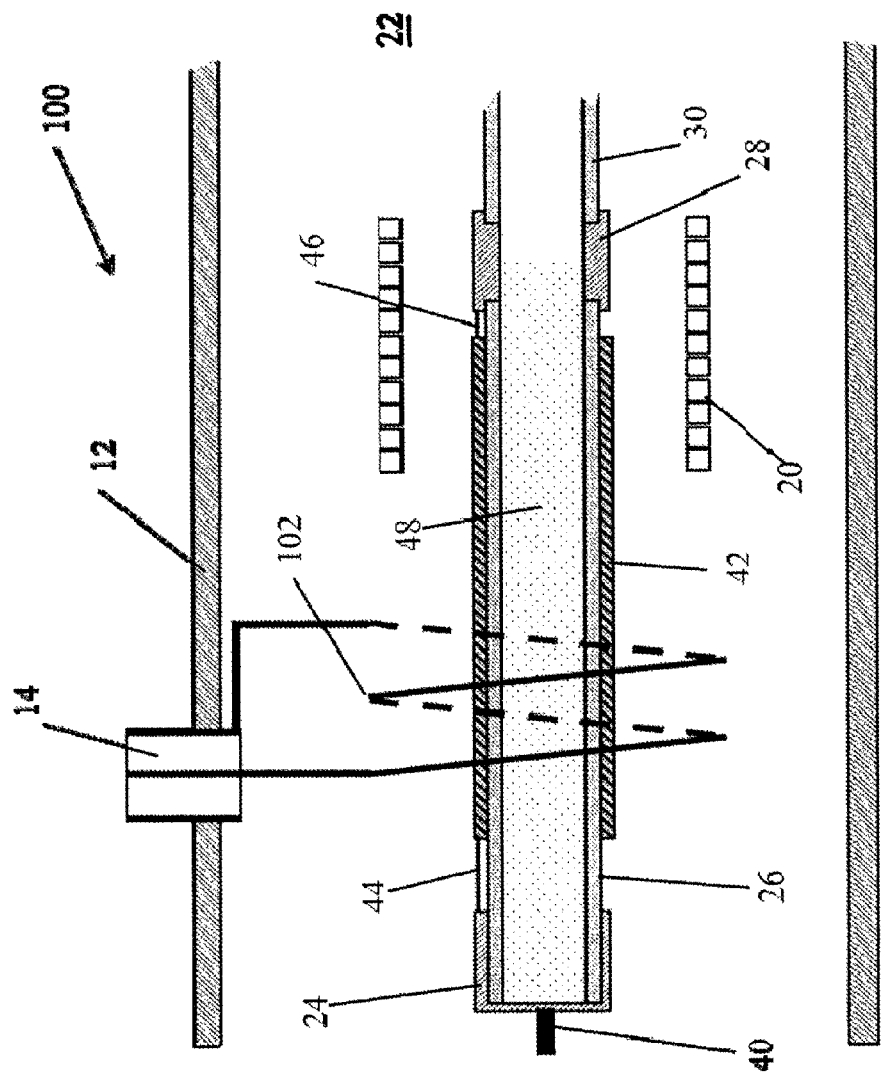
FIG. 5 depicts an apparatus for generating a plasma ion source that includes a primary antenna configured to couple electromagnetic energy to a secondary antenna via inductive coupling according to an embodiment of the invention.

FIG. 5 depicts an apparatus for generating a plasma ion source that includes a primary antenna configured to couple electromagnetic energy to a secondary antenna via inductive coupling. All elements depicted in FIG. 5 correspond to identically numbered elements in FIG. 1. FIG. 5 further includes a sparsely-wrapped coil primary antenna 102 configured to inductively couple electromagnetic energy to the secondary antenna 42. In various embodiments, the secondary antenna 42 couple energy to the plasma via, e.g., inductive, capacitive, or resonant coupling.

Figure 6:
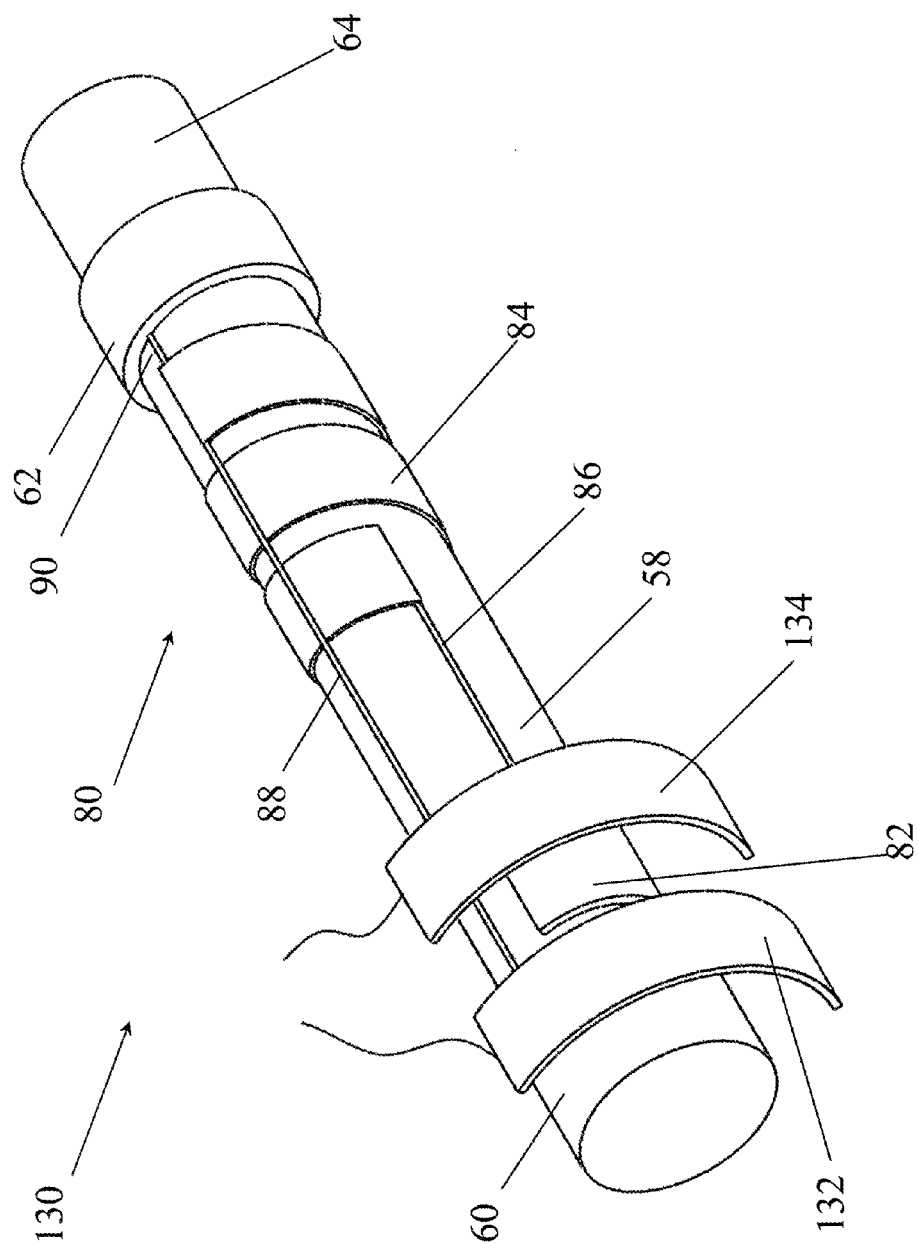
FIG. 6 depicts a primary antenna configuration for coupling electromagnetic energy to a secondary antenna via capacitive coupling according to an embodiment of the invention.

FIG. 6 depicts a primary antenna structure capable of being configured to couple electromagnetic energy to a secondary antenna via capacitive coupling. All elements depicted in FIG. 6 correspond to identically numbered elements in FIG. 4. FIG. 6 further includes a paddle-type primary antenna comprising electrodes 132 and 134. Electrodes 132 and 134 are configured to capacitively couple electromagnetic energy to the secondary antenna structure 84. In this case, the beamstop electrode 60 is configured as a pickup electrode that couples electromagnetic energy received from the electrodes 132 and 134 to the secondary antenna structure 84 via the connector 88. The primary pickup element 82 also couples electromagnetic energy received from the electrodes 132 and 134 to the secondary antenna structure 84 via the connector 86.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An apparatus for generating a plasma ion source in a vacuum chamber, the apparatus comprising:
 a plasma ion source dielectric configured to encapsulate the vacuum chamber;
 a secondary antenna positioned external to an exterior surface of the plasma ion source dielectric and configured to couple electromagnetic (EM) radiation into the plasma ion source in the vacuum chamber; and
 a primary antenna electrically isolated from the secondary antenna and configured to transmit electromagnetic (EM) radiation to the secondary antenna;
 wherein the vacuum chamber, the plasma ion source dielectric, and the secondary antenna are biased at a positive electric potential with respect to the primary antenna.

2. The apparatus of claim 1, further comprising:
 a magnet assembly positioned external to the exterior surface of the plasma ion source dielectric;
 wherein a portion of the secondary antenna is positioned between the exterior surface of the plasma ion source dielectric and the magnet assembly.

3. The apparatus of claim 2, wherein the magnetic structure is comprised of permanent magnets in a hexapole configuration.

4. The apparatus of claim 2, further comprising:
an anode electrode electrically connected to the plasma ion source dielectric; and
a beam stop electrode electrically connected to the plasma ion source dielectric.

5. The apparatus of claim 4, wherein the beam stop electrode is configured to elevate an electric potential of the plasma ion source dielectric and an electric potential of the plasma ion source chamber.

6. The apparatus of claim 5, further comprising a connector electrically connected to the beam stop electrode configured to elevate an electric potential of the beam stop electrode.

7. The apparatus of claim 4, wherein the magnet assembly is positioned adjacent to the anode electrode in a longitudinal axis of the apparatus,
wherein the longitudinal axis extends through the anode electrode and the beam stop electrode.

8. The apparatus of claim 7, wherein the portion of the secondary antenna positioned between the exterior surface of the plasma ion source dielectric and the magnet assembly is positioned adjacent to the anode electrode along the longitudinal axis.

9. The apparatus of claim 7, wherein a second portion of the secondary antenna extends along the longitudinal axis beyond the extent of the magnet assembly along the longitudinal axis.

10. The apparatus of claim 1, further comprising a conducting outer enclosure that encapsulates the plasma ion source dielectric and the secondary antenna.

11. The apparatus of claim 10, wherein the conducting outer enclosure serves as an electric potential ground for the apparatus.

12. The apparatus of claim 10, wherein the primary antenna is electrically connected to the conducting outer enclosure.

13. The apparatus of claim 10, wherein a chamber bounded by the interior surface of the conducting outer enclosure is filled with a dielectric.

14. The apparatus of claim 1, wherein the secondary antenna is coupled to the primary antenna by one of the group consisting of: capacitive coupling, inductive coupling, and resonant coupling.

15. The apparatus of claim 14, wherein the secondary antenna is coupled to the primary antenna by resonant coupling, and
wherein the primary antenna and the secondary antenna are configured to exhibit natural resonant frequencies that match a frequency of EM radiation produced by an external EM source.

16. The apparatus of claim 1, wherein the secondary antenna is configured to couple EM energy into the plasma ion source chamber by one of the group consisting of: capacitive coupling, inductive coupling, and resonant coupling.

17. The apparatus of claim 16, wherein the resonant coupling comprises one of the group consisting of: electron-cyclotron resonance (ECR), ion cyclotron resonance (ICR), and helicon, upper hybrid and other plasma-wave interactions.

18. The apparatus of claim 1, wherein the plasma ion source chamber, the plasma ion source dielectric, and the secondary antenna are elevated to an electric potential between positive 20 kV and positive 1 MV relative to ground.

19. A method for generating a plasma ion source, the method comprising:
radiating, by a primary antenna, electromagnetic (EM) energy;
coupling the EM energy radiated by the primary antenna into a secondary antenna;
radiating, by the secondary antenna, EM energy;
coupling the EM energy radiated by the secondary antenna into a plasma through a plasma ion source dielectric disposed between the secondary antenna and the plasma; and
maintaining an electric potential difference between the primary antenna and each member of the vacuum chamber, the plasma ion source dielectric, and the secondary antenna.

20. The method of claim 19, further comprising confining the plasma by a magnetic field generated by a magnet assembly positioned external to the exterior surface of the plasma ion source dielectric.

* * * * *